United States Patent [19]
Sugiyama

[11] Patent Number: 5,994,199
[45] Date of Patent: Nov. 30, 1999

[54] METHOD FOR FABRICATING SEMICONDUCTOR DEVICE ON SOI SUBSTRATE

[75] Inventor: Mitsuhiro Sugiyama, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/623,510

[22] Filed: Mar. 28, 1996

Related U.S. Application Data

[63] Continuation of application No. 08/273,117, Jul. 11, 1994, abandoned.

[30] Foreign Application Priority Data

Jul. 12, 1993 [JP] Japan ................................. 5-195120

[51] Int. Cl.$^6$ .................................................. H01L 21/762
[52] U.S. Cl. ............................................ 438/404; 438/692
[58] Field of Search .................... 437/62, 67; 156/632.1; 148/DIG. 85, DIG. 86, DIG. 50; 438/404, 406, 692, 759, FOR 222

[56] References Cited

U.S. PATENT DOCUMENTS

| | | |
|---|---|---|
| 4,596,071 | 6/1986 | Kita . |
| 4,725,561 | 2/1988 | Haund et al. ............................ 437/62 |
| 5,084,408 | 1/1992 | Baba et al. . |
| 5,292,689 | 3/1994 | Cronin et al. ............................ 437/67 |
| 5,298,110 | 3/1994 | Schoenborn et al. . |
| 5,308,786 | 5/1994 | Lur et al. ................................. 437/67 |
| 5,336,634 | 8/1994 | Kadayama et al. ...................... 437/62 |
| 5,362,669 | 11/1994 | Boyd et al. . |
| 5,494,857 | 2/1996 | Cooperman et al. . |
| 5,633,190 | 5/1997 | Sugiyama . |

FOREIGN PATENT DOCUMENTS

| | | |
|---|---|---|
| 0562127 | 9/1993 | European Pat. Off. . |
| 58-64045 | 4/1983 | Japan . |
| 62-76646 | 4/1987 | Japan . |
| 63-239929 | 10/1988 | Japan . |
| 118/439 | 7/1989 | Japan . |
| 376249 | 4/1991 | Japan . |

OTHER PUBLICATIONS

Fully SIO Isolated High Speed Self–Aligned Bipolar Transistor on Thin SOI by: H. Nishizawa etal, 1991 VLSI Symposium Technical Digest.

High Performance Complementary Bipolar Technology, By: J. Warnock etal, 1993 VLSI Symposium Technical Digest.

The Effect of Trench Processing Conditions on Complementary Bipolar Analog Devices with SOI/Trench Isolation By: R. Jerome etal., 1993 BCTM.

*Primary Examiner*—George Fourson

[57] ABSTRACT

A semiconductor device includes a plurality of single crystal semiconductor island layers formed on a semiconductor substrate with a first insulating layer intervened therebetween, the single crystal semiconductor island layers being isolated from one another by a second insulating layer. In forming the single crystal semiconductor island layers, a single crystal semiconductor layer is formed and is selectively removed on the first insulating layer. The second insulating layer is buried between adjacent ones of the single crystal semiconductor island layers. The second insulating layer is formed over the entire surface inclusive of the single crystal semiconductor island layers and a surface portion of the second insulating layer is removed by an etching process or a polishing process. Since the non-element regions are buried by the second insulating layer and the single crystal semiconductor island layers are completely isolated from one another, the substrate-related capacitances such as those at wiring regions and resistive parts are reduced.

4 Claims, 11 Drawing Sheets

METHOD FOR FABRICATING SEMICONDUCTOR DEVICE ON SOI SUBSTRATE

This is a continuation of application Ser. No. 08/273,117, filed Jul. 11, 1994, now abandonded.

BACKGROUND OF THE INVENTION (1) Field of the Invention

This invention relates to a semiconductor device and a method for fabricating the same, and more particularly to a semiconductor device formed on an SOI (silicon-oninsulator) substrate and a method for fabricating the same.

(2) Description of the Related Art

Figure 1:
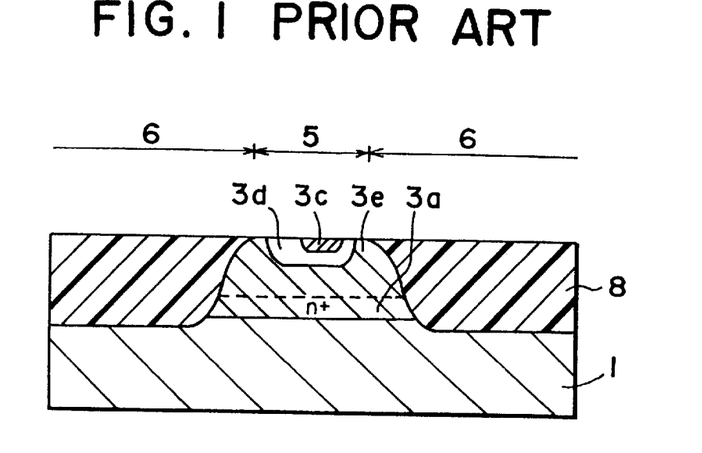
FIG. 1 is a sectional view showing "inter-element isolation by a selective oxidization process" in the prior art.

To assist the understanding of the invention, the prior art is first described with reference to FIGS. 1 to 4. FIG. 1 is a sectional view showing "inter-element isolation by a selective oxidization process" in the prior art, and FIG. 2 is a sectional view showing "inter-element isolation by a trench isolation process" in the prior art.

Figure 3:
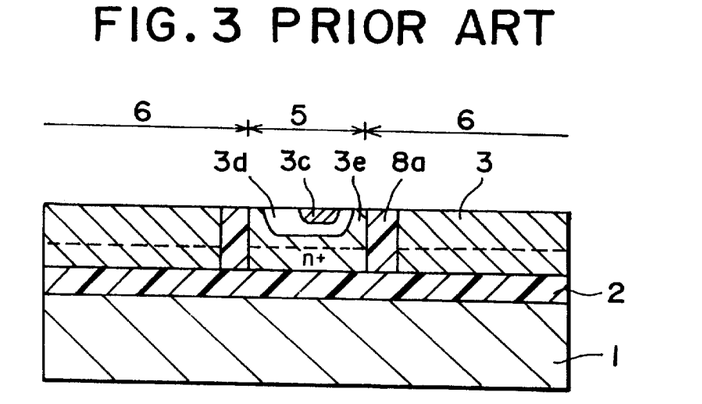
FIG. 3 is a sectional view for showing the formation of element isolation using an SOI substrate in a prior art example.
Figure 4:
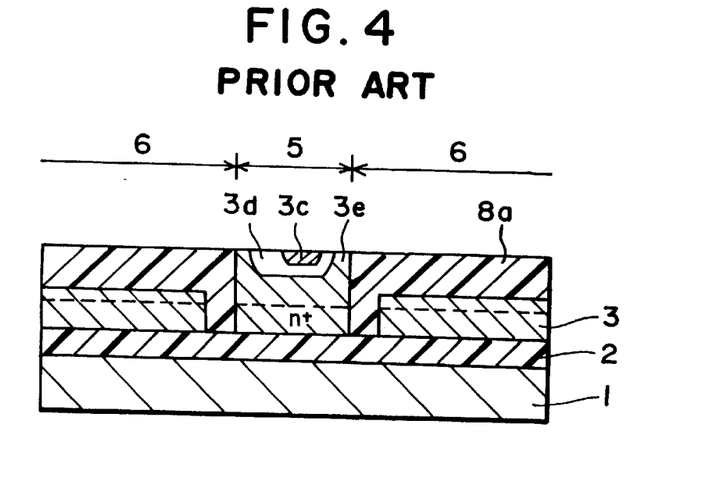
FIG. 4 is a sectional view for showing a semiconductor chip with a combination of a deep trench for inter-element isolation and a shallow trench for minimizing capacitances to the substrate in a prior art example.

FIG. 3 is a sectional view for showing the formation of element isolation using an SOI substrate in a prior art example, and FIG. 4 is a sectional view for showing a semiconductor chip with a combination of a deep trench for inter-element isolation and a shallow trench for minimizing substrate-related capacitances (i.e., capacitances to the substrate) in a prior art example.

In FIGS. 1 to 4, like parts are designated by like reference numerals and symbols, designated at 1 is a silicon substrate, at 2 a silicon oxide film, at 3 a single crystal silicon layer, at $3a$ an $n^+$-buried layer, at $3c$ an emitter region, at $3d$ a base region, at $3e$ a collector region, and at 8 and $8a$ a silicon oxide film. Designated at 5 is an element region, and at 6 a non-element region.

Figure 2:
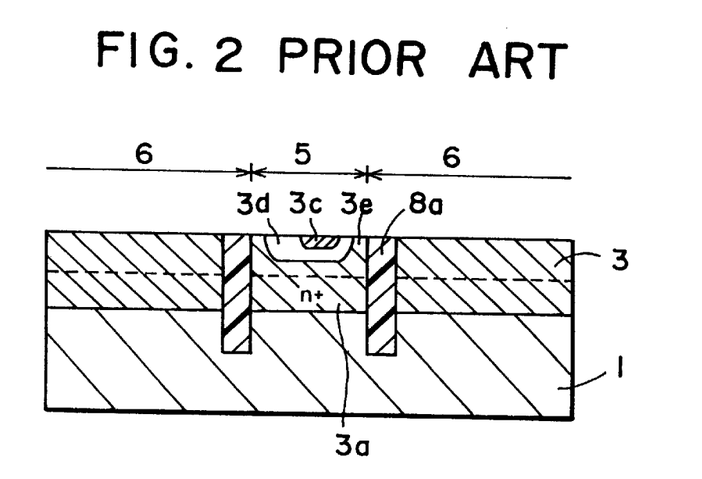
FIG. 2 is a sectional view showing "inter-element isolation by a trench isolation process" in the prior art.

Heretofore, in a bipolar type semiconductor integrated circuit using a silicon substrate, the inter-element isolation is made using the selective oxidization process as illustrated in FIG. 1 or the trench separation process as illustrated in FIG. 2.

In the selective oxidization process, the inter-element isolation is made by selectively forming a silicon oxide film 8 using a patterned silicon nitride film or the like as a mask (see FIG. 1). In the trench isolation process, the inter-element isolation is made by forming a trench around each element by silicon etching and filling the trench with polycrystalline silicon or an insulator, e.g., silicon oxide film $8a$ (See FIG. 2).

Recently, high quality SOI substrates based on a SIMOX (separation by implanted oxygen) process and a wafer-bonding process have become available, and thus it has become possible to isolate completely an element region 5 with an insulator as shown in FIG. 3 by forming a trench in the surface of a non-element region 6 of a single crystal silicon layer 3 which is formed on a silicon substrate 1 via a silicon oxide film 2 such that the trench reaches the silicon oxide film 2 and filling the trench with a silicon oxide film $8a$.

In the structure shown in FIG. 3, the single crystal silicon layer in the element region 5 is completely enclosed by the insulator. Thus, with this structure, compared to the usual selective oxidization isolation structure (see FIG. 1) or the trench isolation structure (see FIG. 2) using a silicon substrate, the reliability of insulator isolation is improved. In addition, there is the following advantage.

Where the SOI structure shown in FIG. 3 is utilized, the junction capacitances corresponding to those present between n-type collector region $3e$ and the p-type silicon substrate 1 in the selective oxidization process in FIG. 1 or the trench isolation process in FIG. 2, are insulating film capacitances of the silicon oxide film 2 (see FIG. 3). Where the thickness of the silicon oxide film 2 exceeds about 0.2 $\mu$m, the capacitances are low compared to the junction capacitances noted above. This is advantageous for the operation speed increase of element.

The element isolation using such SOI substrate, is basically the same as the usual trench isolation process using a silicon substrate (see FIG. 2). In this case, the trench is formed selectively in the single crystal silicon layer 3 from the surface of a non-element region by using the ordinary photolithographic technique (see FIG. 3).

In this technique, the etching is silicon etching based on a dry etching process, and the trench as shown in FIG. 3 can be easily formed by suitably selecting a condition of satisfactory selectivity with respect to the silicon oxide film.

Further, the burying of the insulator in the trench is possible as in the usual trench isolation process using a silicon substrate, and a perfect insulator isolation structure is obtainable without a substantial process change.

In the structure shown in FIG. 3, the non-element region 6 is constituted by the same single crystal silicon layer 3 as in the element region 5. The single crystal silicon layer 3 is usually an impurity-doped conductor. Therefore, where interconnects or wiring are formed on this layer via an insulator, wiring-substrate capacitances are high compared to the case where the thick silicon oxide film 8 formed by the selective oxidization process as shown in FIG. 1 is present.

Accordingly, in the prior art structure as shown in FIG. 3, there is provided with selective oxidization as shown in FIG. 1. Alternatively, as shown in FIG. 4, a deep trench for isolating inter-elements and a shallow trench for reducing the substrate-related capacitances.

With such structures, it is possible to reduce wiring-substrate capacitances to certain extents and improve the switching speed of a semiconductor integrated circuit.

The structure as shown in FIG. 4 has been reported under the title "FULLY SiO$_2$ HIGH SPEED SELF-ALIGNED BIPOLAR TRANSISTOR ON THIN SOI" by H. Nishizawa et al. in "Symposium on VLSI Technology Digest", 1991, pp. 51–52.

In the prior art example shown in FIG. 4, in the shallow trench part of the non-element region 6, the single crystal silicon layer 3 still remains under the shallow trench and over the silicon oxide film 2. Thus, the wiring-substrate capacitances are insulating film capacitances of the silicon oxide film $8a$ in the shallow trench and the silicon oxide film 2.

In view of the speed increase of the semiconductor integrated circuit, the non-element region 6 is suitably a thicker insulating film. However, if it is intended to increase the thickness by the selective oxidization process as shown in FIG. 1, it will result in a high stress generated on the element region. Such a structure is inadequate.

Further, the structure as shown in FIG. 4 is required to form the deep and shallow trenches separately, thus increasing the number of fabrication steps for the element isolation.

Figure 5:
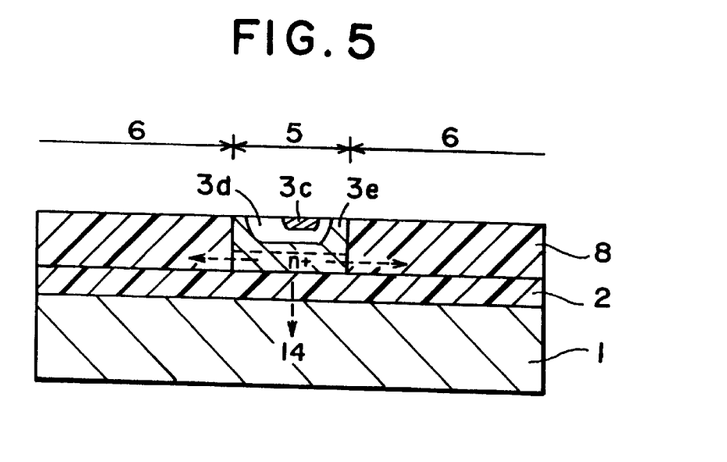
FIG. 5 is a sectional view showing a semiconductor device of a first embodiment according to the invention, for use in explaining the dissipation of heat generated in the element region.

FIG. 5 is a sectional view showing a first semiconductor device according to the invention to be described later in detail. The Figure is for describing the dissipation of heat generated in the element region.

In this case, as shown in FIG. 5, the silicon oxide film 8 or like insulator may bury the entire non-element region 6 other than the element region 5 on the silicon oxide film 2. With this structure, it is possible to make a large reduction in the wiring-substrate capacitances.

However, the structure shown in FIG. 5 has a drawback that the dissipation of heat generated in the element region 5 and heat generated in the wiring and resistive element parts in the non-element region 6 is inferior.

Specifically, the thermal conductivity of silicon is about 170 $Wm^{-1}K^{-1}$, while the thermal conductivity of the silicon oxide film is about $\frac{1}{100}$ of this value. Therefore, since heat generated in the semiconductor integrated circuit is not efficiently dissipated to the silicon substrate, such semiconductor integrated circuit is not suitable to be used in the application where power consumption is large.

Figure 6:
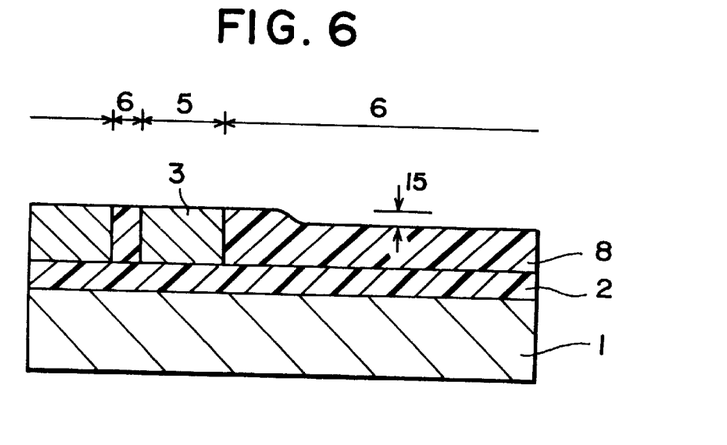
FIG. 6 is a view for illustrating a "recession" which is formed in a flattening process during the polishing of a silicon oxide film.

FIG. 6 is a view for describing the "recession" which is formed in a flattening process by way of polishing the silicon oxide film.

The recession will be described later in detail. To flatten the silicon oxide film 8 by polishing, it is necessary to make slight over-polishing by taking fluctuations of the polishing speed in the surface of the silicon substrate 1 into considerations. Therefore, the recession 15 as shown in FIG. 6, although varied in dependence on the method and conditions of polishing, is formed in the non-element region 6, thus making it difficult to make a completely flattened or uniform surface.

SUMMARY OF THE INVENTION

The invention is intended to solve the above explained problems, and its object is to provide a semiconductor device using an SOI substrate and a method for fabricating the same, which:

permits reduction of capacitances between the substrate and the wiring regions or resistive parts;

permits heat generated in the element region, wiring region and resistive part to be dissipated efficiently to the substrate;

precludes the recession noted above formed in the process of flattening the silicon oxide film 8 by polishing; and reduces the number of fabrication steps for the element isolation.

The invention is described from six aspects along with respective functions.

As a first aspect of the invention, there is provided a first semiconductor device comprising:

a first insulating layer formed on a surface of a semiconductor substrate;

a plurality of single crystal semiconductor island layers formed on the first insulating layer; and a second insulating layer formed on the first insulating layer and completely isolating the plurality of single crystal semiconductor island layers from one another.

With the semiconductor device of the first aspect, in the non-element region the buried silicon oxide film on the SOI substrate is wholly an insulator, thus permitting reduction of the wiring-substrate capacitances.

As a second aspect of the invention, there is provided a method for fabricating a second semiconductor device, the method comprising the steps of:

forming a plurality of single crystal semiconductor island layers by partly removing a single crystal semiconductor layer formed on a surface of a semiconductor substrate via an insulating layer; and burying a second insulating layer between adjacent ones of the single crystal semiconductor island layers by forming the second insulating layer over the entire surface inclusive of the single crystal semiconductor island layers and then removing a surface portion of the second insulating layer by one of an etching process and a polishing process.

With the semiconductor device of the second aspect, in the formation of the first semiconductor device, it is possible to suppress formation of the recession in the non-element region that is generated by insulating film polishing used in the insulator burying step.

As a third aspect of the invention, there is provided a third semiconductor device comprising a silicon oxide film formed on a silicon substrate, a single crystal silicon island layer formed on the silicon oxide film, and a dielectric island layer formed on the silicon oxide layer and isolated from the single crystal silicon island layer by an insulator.

With the semiconductor device of the third aspect, like the semiconductor device of the second aspect, it is possible to suppress the formation of the recession in the non-element region. In addition, by using a dielectric island layer having a higher thermal conductivity than that of the silicon oxide film, it is possible to obtain efficient dissipation of heat generated in the wiring region, resistive part, etc. to the silicon substrate.

As a fourth aspect of the invention, there is provided a fourth semiconductor device comprising a silicon oxide film formed on a silicon substrate, a first single crystal silicon island layer formed on the silicon oxide film, and a dummy layer constituted by a second single crystal silicon island layer formed on the silicon oxide film and isolated by an insulator from the first single crystal silicon island layer such as to surround the first single crystal silicon island layer.

With the semiconductor device of the fourth aspect, it is possible to obtain efficient dissipation of heat generated in the single crystal island layer as an element region to the silicon substrate through the dummy layer surrounding the single crystal island layer.

As a fifth aspect of the invention, there is provided a fifth semiconductor device comprising a first silicon oxide film, a polycrystalline silicon film and a second silicon oxide film, these films being formed in the mentioned order on a silicon substrate, and a plurality of single crystal silicon island layers formed on the second silicon oxide film and isolated from one another by an insulator.

With the semiconductor device of the fifth aspect, it is possible to obtain efficient dissipation of heat generated in the single crystal silicon island layers as element regions isolated by the insulator, to the polycrystalline silicon layer and also to the silicon substrate through the first and second silicon oxide layers formed as thin layers.

Further, if the polycrystalline silicon layer is not doped with any impurity, it functions as a dielectric, and thus the capacitances between the element and the silicon substrate are not increased.

As a sixth aspect of the invention, there is provided a sixth semiconductor device comprising a plurality of island lamination regions formed on a silicon substrate via a first silicon oxide layer and isolated from one another by an insulator, the island lamination regions each including a polycrystalline silicon layer, a second silicon oxide layer and a single crystal silicon layer.

With the semiconductor device of the sixth aspect, it is possible to obtain efficient dissipation of heat generated in the single crystal silicon layers as element regions isolated by the insulator, to the silicon substrate through the thin first silicon oxide layer, the polycrystalline silicon layer and the thin second silicon oxide layer.

Further, if the polycrystalline silicon layer is not doped with any impurity, it functions as a dielectric, and thus the capacitances between the element and the silicon substrate are not increased.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF PREFERRED EMBODIMENTS

Now, preferred embodiments of the invention are described with reference to the drawings.

FIGS. 7A–7D show sectional views of semiconductor chips in successive steps for describing a first embodiment of the invention.

Figure 7A:
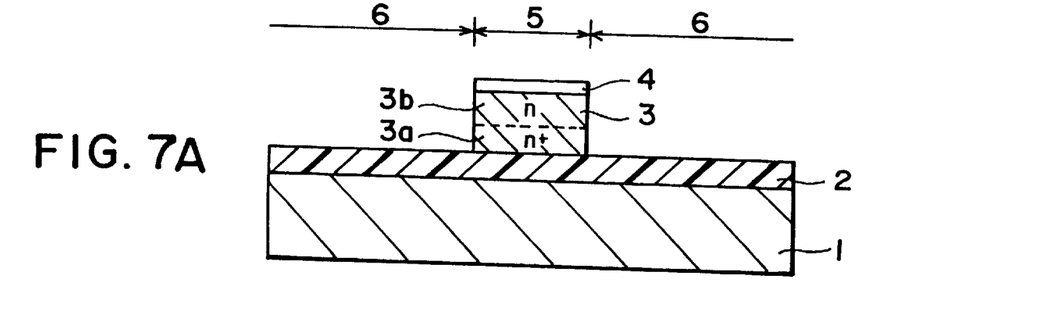
FIGS. 7A–7D are sectional views of semiconductor chips in successive steps for explaining the first embodiment according to the invention.

First, in the step in FIG. 7A, an SOI substrate is prepared, which has a single crystal silicon layer 3 formed on a silicon substrate 1 via a silicon oxide layer 2.

The SOI substrate may be prepared by a SIMOX process or a wafer-bonding process.

In the application of the embodiment to a bipolar semiconductor integrated circuit, the thickness of the single crystal silicon layer 3 is set to about 2 $\mu$m, and it comprises an $n^+$-type buried layer 3a, and an n-type epitaxial layer 3b (see step in FIG. 7A). The thickness of the silicon oxide film 2 is set to 0.3 to 1.0 $\mu$m.

Then, as shown in step in FIG. 7A, a silicon nitride film 4, which serves as an etching stopper in a step later, on the single crystal silicon layer 3. Then, the silicon nitride film 4 and the single crystal silicon layer 3 are selectively removed by the dry etching process using the ordinary photolithography, thus forming a single crystal silicon island layer 3 in the element region 5.

Figure 7B:
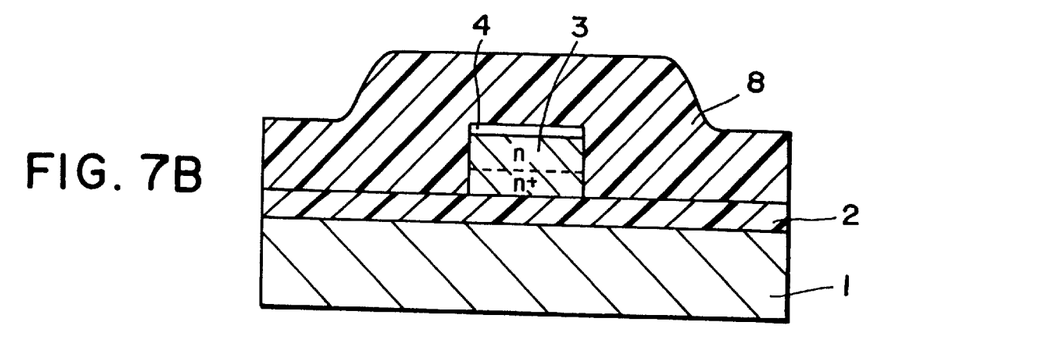

Then, as shown in step in FIG. 7B, a thick silicon oxide layer 8 is deposited on the entire surface. The thickness of the layer is suitably at least double the thickness of the single crystal silicon layer 3.

Figure 7C:
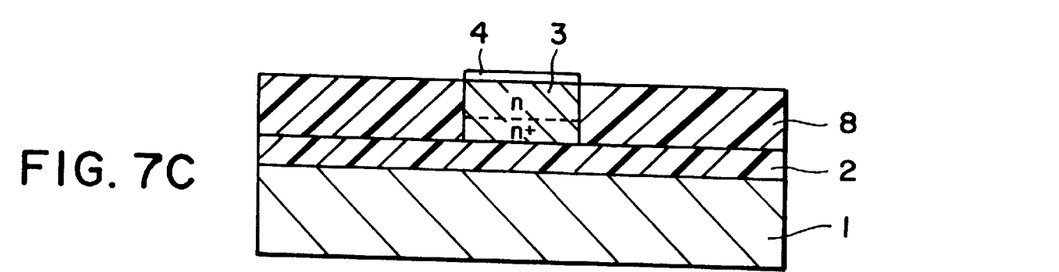

Subsequently, the silicon oxide layer 8 is polished for flattening thereof as shown in step in FIG. 7C.

As usual means for such polishing is frequently used a slurry obtained by adding 20 to 30 nm of silica particles to an alkali solution. By using the slurry and a polishing plate under an appropriate condition it is possible to set various values of polishing rates between the silicon oxide film and the silicon nitride film or other materials.

In the first embodiment of the invention, the silicon nitride film 4 is used as a stopper for the polishing of the silicon oxide film 8.

More specifically, the polishing rate ratio between the silicon nitride film and the silicon oxide film may be set to 1:5 or above, and therefore the silicon nitride film 4 may be used sufficiently as the stopper by appropriately selecting its thickness.

Subsequently, the silicon nitride film 4 is removed, and then, as shown in step in FIG. 7D, a semiconductor element (i.e., an emitter region 3c, a base region 3d and a collector region 3e) is formed in the single crystal silicon layer 3 in the element region 5.

An example of the semiconductor device formed in the first embodiment will be described with reference to FIG. 8 (a top view). As shown, it is possible to form element regions 5 as desired in a non-element region 6. The non-element region 6 is entirely buried in the silicon oxide film 8 as shown in step in FIG. 7D.

In this first embodiment, the substrate-related capacitances of the wiring regions and the resistive parts formed on the non-element region 6 may be greatly reduced compared to those in the prior art. This is advantageous for the operation speed increase of the semiconductor integrated circuit.

Figure 7D:
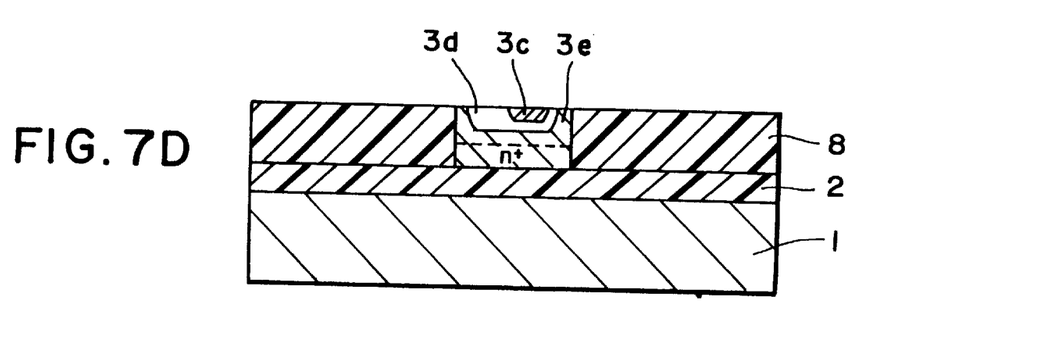
Figure 8:
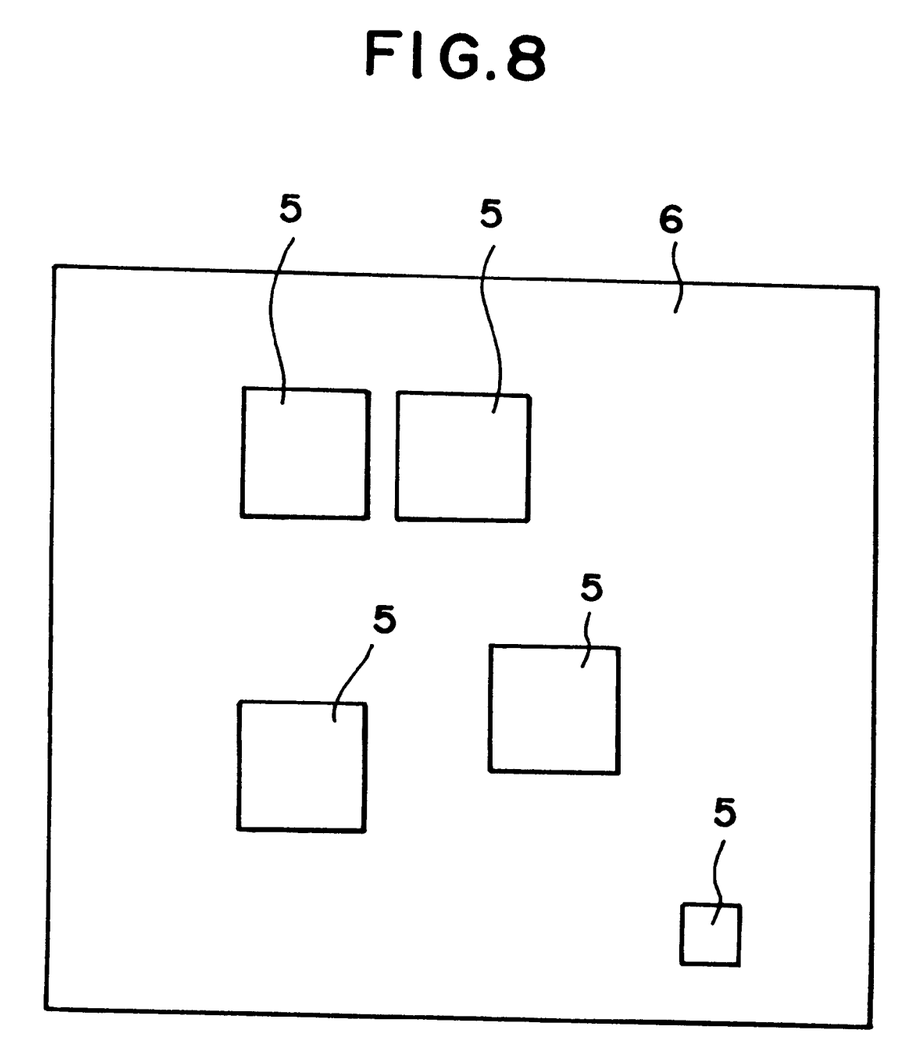
FIG. 8 is a top view of the semiconductor device of the first embodiment.

For example, while in the prior art example shown in FIG. 3 the thickness of the silicon oxide film 2 is usually about 0.5 $\mu$m, in this first embodiment the total thickness of the silicon oxide films 2 and 8 shown in step in FIG. 7D is 1.5 to 2.5 $\mu$m. That is, the substrate-related capacitances can be reduced to 1/3 to 1/5 of those in the prior art.

Further, in the prior art example shown in FIG. 4 the thickness of the silicon oxide film 8a buried in the shallow trench is usually 0.5 $\mu$m, while the thickness of the silicon oxide film 2 is 0.5 $\mu$m, thus amounting to a total thickness of about 1 $\mu$m. Thus, in the first embodiment, it is estimated that the substrate-related capacitances can be reduced by 1/1.5 to 1/2.5 of those in the prior art example of FIG. 4.

Further, in the first embodiment, compared to the prior art example shown in FIG. 4, it is possible to obtain great reduction of the steps of manufacture.

For example, in the case of FIG. 4 two photolithographic steps are necessary for the formation of the deep and shallow trenches. In the first embodiment, on the other hand, only a single process is needed. Thus, it is possible to reduce the number of steps for the element isolation.

Further, the first embodiment has a problem that a difference of flattening is produced in the silicon oxide polishing between a portion with the element regions being dense and a portion with such region not being dense.

That is, as shown in FIG. 6, a recession 15 is produced in a portion of the silicon oxide film 8, in which adjacent element regions 5 are widely spaced apart.

The formation of the recession is attributable to the fact that it is necessary to make over-polishing to some extent to provide an allowance for "fluctuations" of the thickness of the deposited silicon oxide film on the substrate surface and also "fluctuations" of the polishing speed in the substrate surface.

For example, if the distance between adjacent element regions 5 is about 100 μm, a recession corresponding to about 20% of the total polishing extent will be produced in view of the allowance for fluctuations of the polishing.

Where the thickness of the element region is 2 μm while the silicon oxide film is deposited to about 3 μm, the extent of recession is 0.6 μm. Since the thickness of the element region is 2 μm, the recession is about ⅓ of the thickness of the element region. With such a recession, the flattening cannot be perfect.

FIGS. 9A–9D show sectional views of semiconductor chips in successive steps for describing a second embodiment of the invention.

The second embodiment has an aim of solving the problem in the first embodiment that "the flattening varies".

First, the same SOI substrate as in the first embodiment is prepared. Thus, as shown in step in FIG. 9A, like the first embodiment, a silicon nitride film 4 which serves as an etching stopper in a later step is formed thinly on the single crystal silicon layer 3, and then the silicon nitride film 4 and the single crystal silicon layer 3 in the non-element region 6 are selectively removed by the dry etching process using the ordinary photolithography.

Figure 9A:
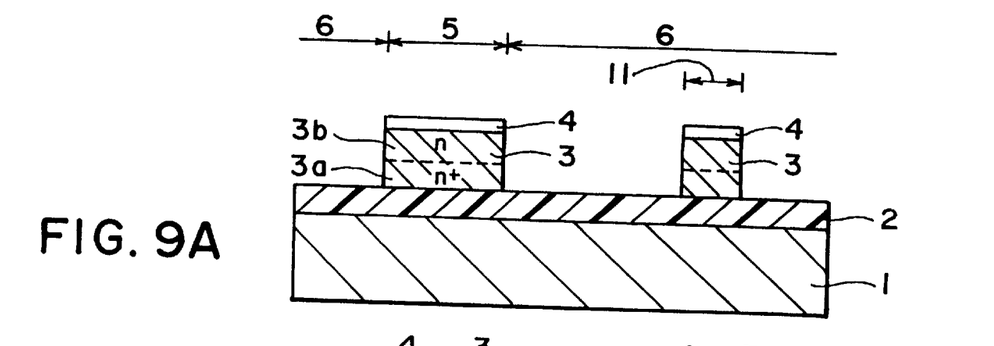
FIGS. 9A–9D are sectional views of semiconductor chips in successive steps for explaining a second embodiment according to the invention.

At this time, a dummy region 11 having the same structure as the element region 5 is formed on a portion of the non-element region 6 where elements are not dense (see step in FIG. 9A).

Figure 9B:
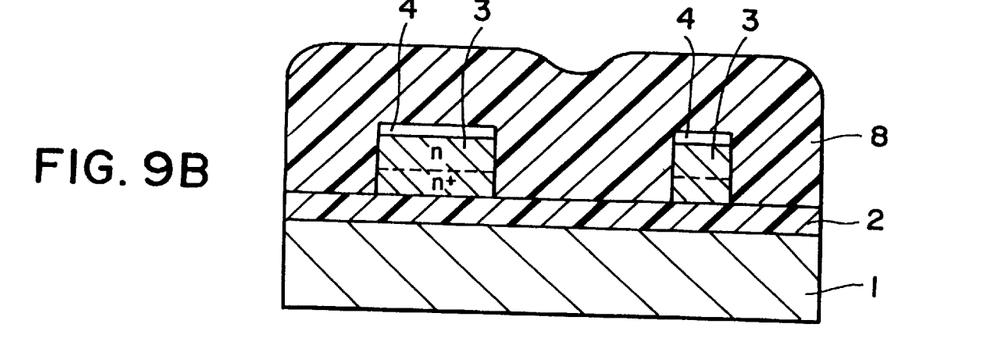
Figure 9C:
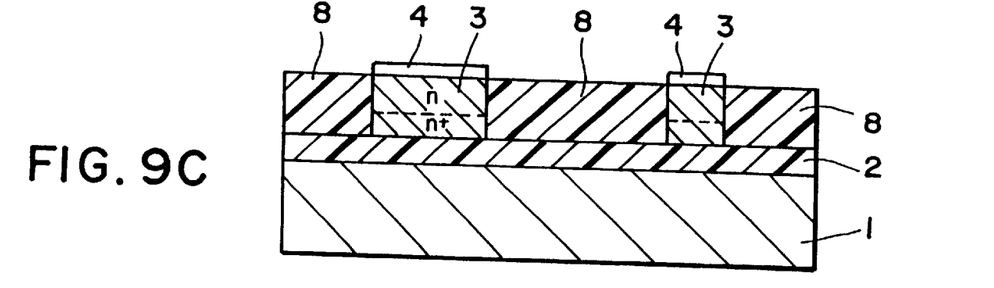
Figure 9D:
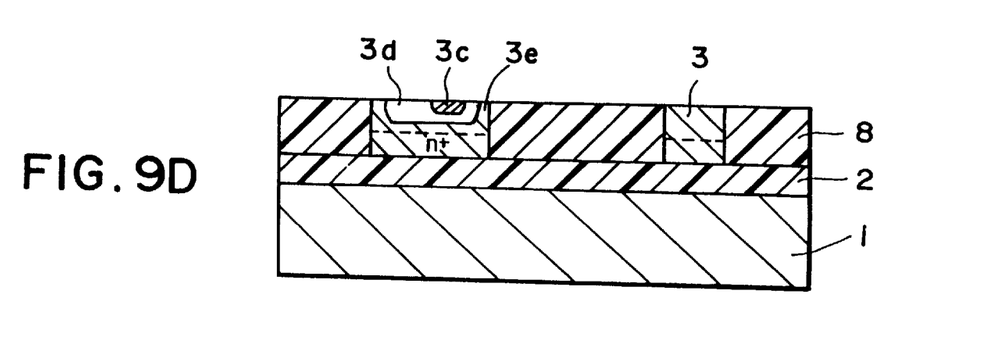

The subsequent steps are as steps in FIGS. 9B to 9D. These steps are the same as the steps in FIGS. 7B to 7D in the first embodiment, so they are not described again.

In carrying out the second embodiment of the invention, sufficient effects are obtainable when the following are taken into considerations.

Where the dummy region 11 is provided over a broad area of the region other than the element region 5, substrate-related capacitances are present at the wiring directly above such dummy region. For this reason, it is sufficient to provide pillar-like dummy regions each of which has a square area with one side being 5 μm and which are located sparsely with a space therebetween not greater than 50 μm.

With such provision of pillar-like dummy regions 11 at the non-element region 6, even if the silicon oxide film 8 buried in the other region than the element regions is polished somewhat excessively for eliminating extra capacitances to be present at the wiring, it is possible to minimize the recession in the silicon oxide buried region.

The smaller the interval of disposition of the dummy regions 11, the less the recession is with the same extent of over-polishing. However, it is meaningless to dispose the dummy regions 11 too densely. Thus, by taking the thickness of the element region 65, thickness fluctuations of the silicon oxide film 8, substrate inner film thickness fluctuations, polishing speed fluctuations in the substrate into considerations, the dummy regions 11 may be provided with intervals at which a recession will not cause a problem.

FIGS. 10A–10D show sectional views of semiconductor chips in successive steps for describing a third embodiment of the invention.

Figure 10A:
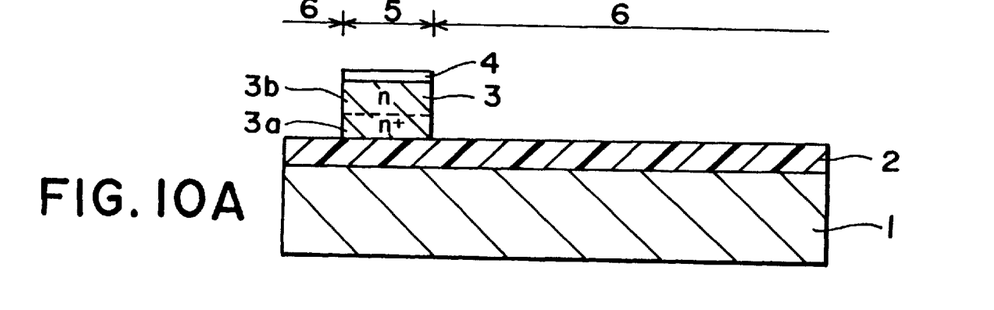
FIGS. 10A–10D are sectional views of semiconductor chips in successive steps for explaining a third embodiment according to the invention.

First, as shown in step in FIG. 10A, an SOI substrate is prepared, which has a single crystal silicon layer 3 formed on a silicon substrate 1 via a silicon oxide film 2.

The SOI substrate may be formed by using the SIMOX process or the wafer-bonding process.

Where the embodiment is applied to a bipolar semiconductor integrated circuit, the thickness of the single crystal silicon layer 3 is set to about 2 μm, and the thickness of the silicon oxide film 2 is set to 0.3 to 1.0 μm.

Then, a silicon nitride film 4, which serves as an etching stopper in a later step, is formed thinly on the single crystal silicon layer 3. Then, the silicon nitride film 4 and the single crystal silicon layer 3 are removed selectively by the dry etching process using the ordinary photolithography, thus forming a single crystal silicon island layer 3 (see step in FIG. 10A).

Figure 10B:
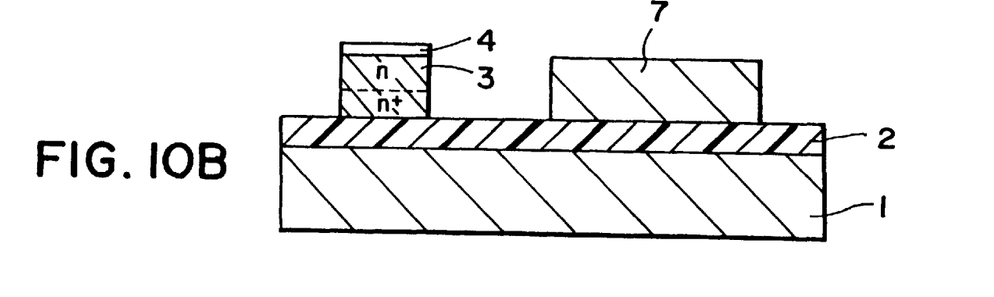

Subsequently, as shown in step in FIG. 10B, the entire surface is covered by a silicon carbide film 7 with the same thickness as the single crystal silicon layer 3.

The silicon carbide film 7 can be formed by a CVD (Chemical Vapor Deposition) process using such reaction gases as $C_2H_2$ and $Si_2H_2$.

Subsequently, the silicon carbide film 7 is patterned to form an island silicon carbide film 7 (see step in FIG. 10B).

The island silicon carbide film 7 may be formed over a major portion of the non-element region 6 such that it is spaced apart from the element regions 5. Alternatively, it may be formed only over a portion which is subject to much heat generation from the semiconductor integrated circuit.

Then, a silicon oxide film 9 is deposited thickly on the entire surface. The thickness is suitably at least double the thickness of the single crystal silicon layer 3.

Figure 10C:
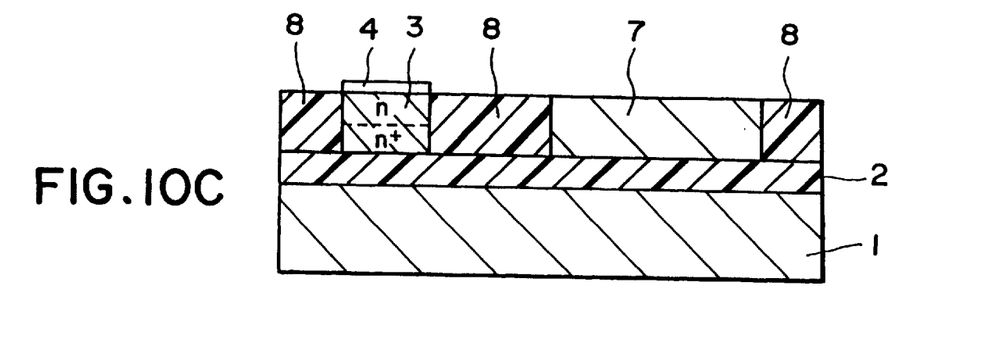

The silicon oxide film 8 is then polished for burying it between the single crystal silicon island layer 3 and the silicon carbide layer 7 as shown in step in FIG. 10C. Subsequently, as shown in step in FIG. 10D, like the preceding first and second embodiments, a semiconductor element (i.e., an emitter region 3c, a base region 3d and a collector region 3e) is formed in the single crystal silicon layer 3 in the element region 5.

Figure 10D:
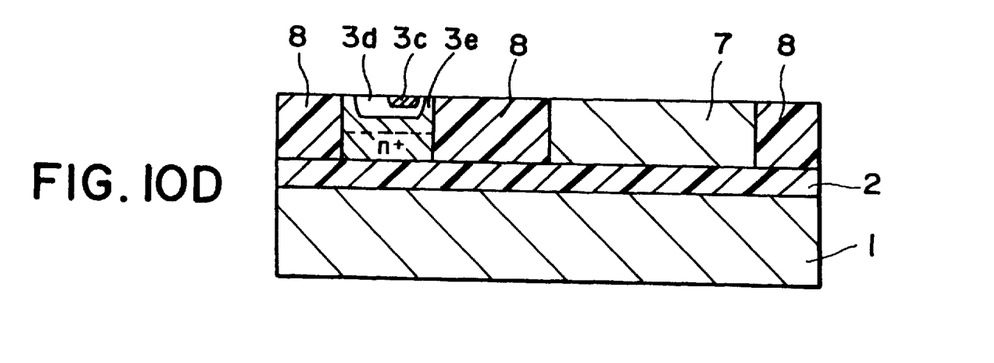

In this third embodiment, a major portion of the non-element region 6 can be formed by the silicon carbide film 7 in lieu of the prior art silicon oxide film (see step in FIG. 10D).

Silicon carbide is generally a ceramic material having a character of a semiconductor. In the absence of doped impurity, however, it can be treated as a dielectric with a dielectric constant of about 10.

Further, silicon carbide has a thermal conductivity of about 270 $Wm^{-1}K^{-1}$, a value equal to or higher than that of the silicon crystal. This value is about 100 times 1.4 to 1.6 Wm$^{-1}$K$^{-1}$ which is the thermal conductivity of the silicon oxide film, thus permitting efficient dissipation of heat generated on the surface of the non-element region to the side of the silicon substrate 1.

A further feature of the silicon carbide resides in that the coefficient of thermal expansion is substantially the same as that of silicon single crystal.

Thus, where a major portion of the non-element region 6 is formed with the silicon carbide film 7, it is possible to minimize the influence of the stress on the non-element region 6.

FIGS. 11A–11D show sectional views of semiconductor chips in successive steps for describing a fourth embodiment of the invention.

Figure 11A:
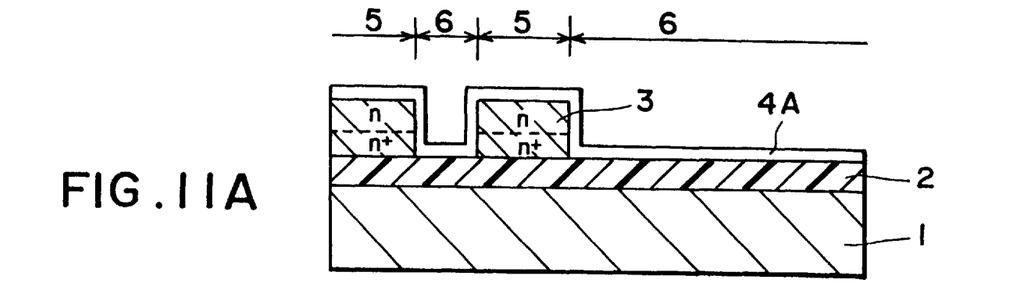
FIGS. 11A–11D are sectional views of semiconductor chips in successive steps for explaining a fourth embodiment according to the invention.

First, as shown in step in FIG. 11A, like the third embodiment, the single crystal silicon layer 3 on the silicon oxide film 2 is selectively etched so that it is left only on the element region 5. Then, a silicon nitride film 4A is formed on the entire surface.

Then, a silicon carbide film 7 is formed on the entire surface and then patterned to leave its island on the non-element region 6. In this embodiment, the distance 10B between the single crystal silicon island layer 3 and the silicon carbide layer 7 at this time is set to be the same as the distance 10A between adjacent single crystal silicon island layers 3 (see step in FIG. 11B).

In this case, the same burying process as in the prior art example shown in FIG. 3 can be used, and there is no need for using the method of polishing as described before in connection with the first to third embodiments.

Figure 11B:
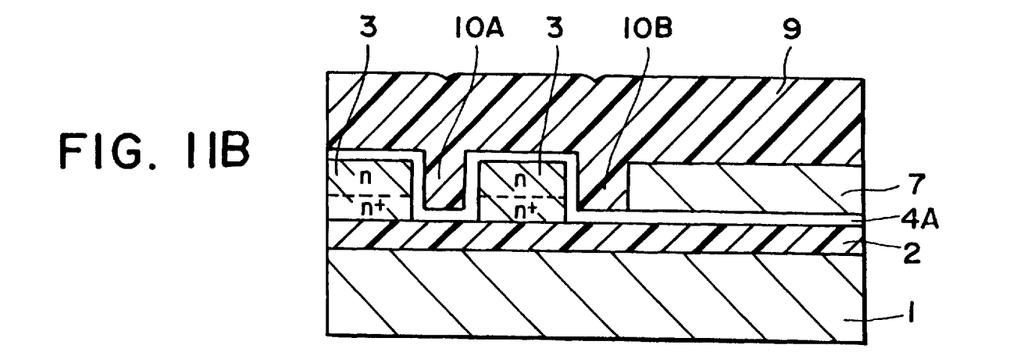

Then, as shown in step in FIG. 11B, a thick borophosphosilicate glass (BPSG film) 9 is deposited.

Figure 11C:
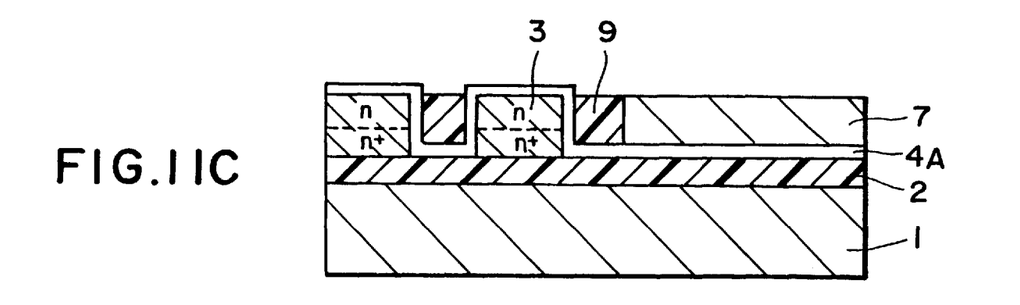

Subsequently, as shown in step in FIG. 11C, the BPSG film 9 is thermally treated at 1,000° C. for reflow, and then etched-back by the dry etching process to flatten the surface by leaving it only in the trenches 10A and 10B.

Figure 11D:
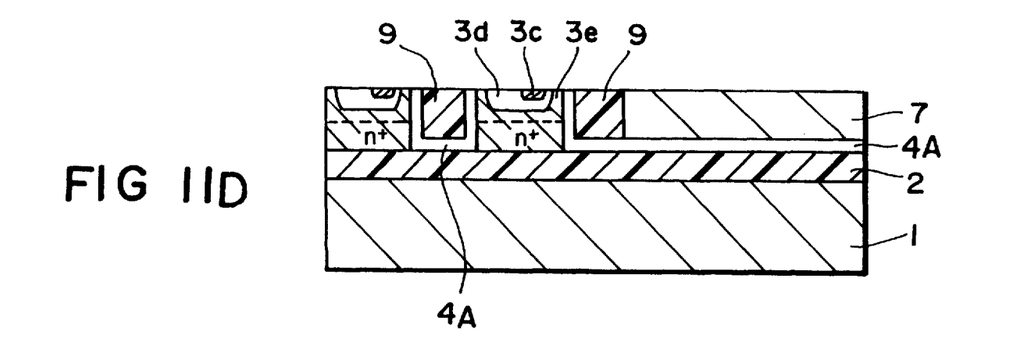

Then, as shown in step in FIG. 11D, a semiconductor element (an emitter region 3c, a base region 3d and a collector region 3e) is formed in the single crystal silicon layer 3 in the element region 5.

This fourth embodiment has an advantage that the prior art burying process can be used directly. It is thus possible to solve the problem of the recession in the insulator isolation region by the polishing process as shown in FIG. 6.

Further, since the silicon nitride film 4A is formed on the silicon oxide film 2, it is possible to prevent impurity dispersion from the BPSG film 9.

Figure 12A:
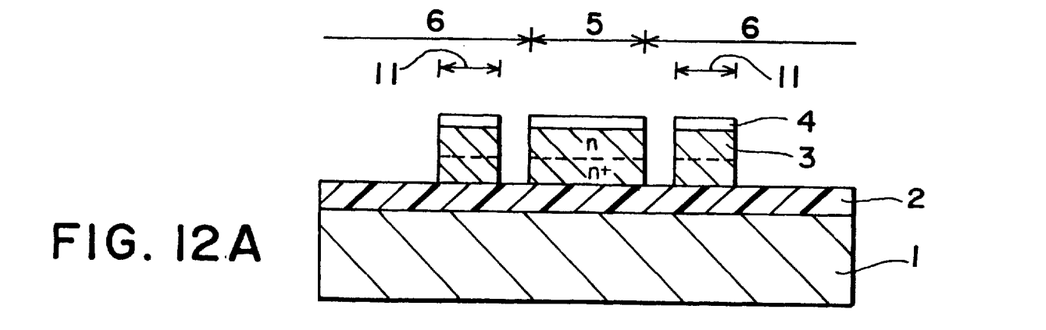
FIGS. 12A–12D are sectional views of semiconductor chips in successive steps for explaining a fifth embodiment according to the invention.
Figure 12B:
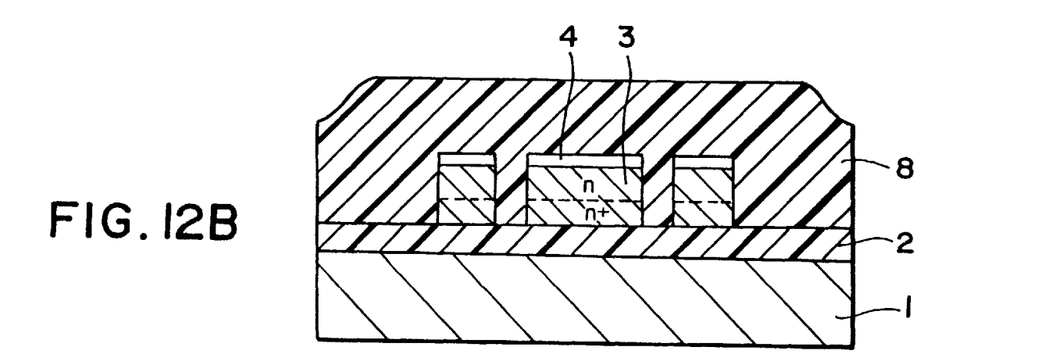

FIGS. 12A–12D show sectional views of semiconductor chips in successive steps for describing a fifth embodiment of the invention. FIG. 13 is a plan view of the semiconductor chip formed in the fifth embodiment. A sectional view taken along line 12A—12A in FIG. 13 corresponds to steps in FIGS. 12A–12D.

First, an SOI substrate like that in the first embodiment is prepared.

Then, as shown in step in FIG. 12A, like the first embodiment, a silicon nitride film 4, which serves as an etching stopper in a later step, is formed thinly on the single crystal silicon layer 3. Then, the silicon nitride film 4 and the single crystal silicon layer 3 in the non-element region 6 other than the element regions 5 and dummy regions 11, are selectively removed by the dry etching process using the ordinary photolithographic technique, thus forming single crystal silicon island layers 3.

At this time, as shown in FIG. 13, the single crystal silicon layer 3 in the dummy region 11 is formed such as to surround the associated element region 5. However, the element region need not be surrounded entirely.

The distance between the element region 5 and the associated dummy region 11 may be set to about 0.5 to 1.0 μm as in the usual trench isolation, but it may be less depending on the processing technique.

If the distance between the element region 5 and the dummy region 11 is too large, it is undesired in that not only the device size is increased, but also heat dissipation effect as will be described later is reduced.

Setting the distance to be constant is desired in that heat can be dissipated uniformly in all directions.

Subsequently, as shown in step in FIG. 12B, a thick silicon oxide film 8 is deposited over the entire surface. The thickness of the silicon oxide film 8 is desirably above the thickness of the single crystal silicon layer 3.

Figure 12C:
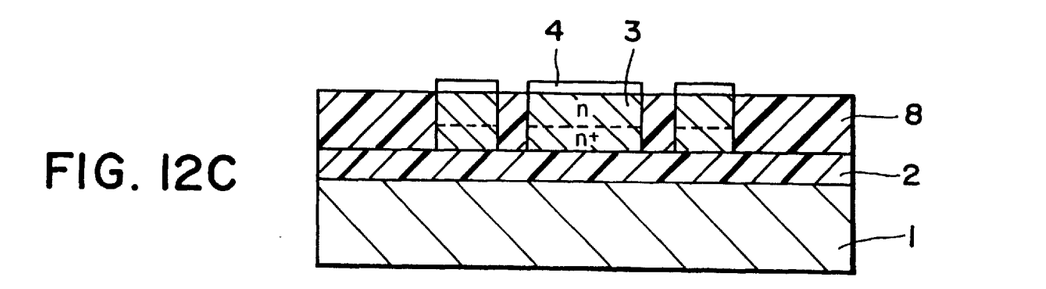
Figure 13:
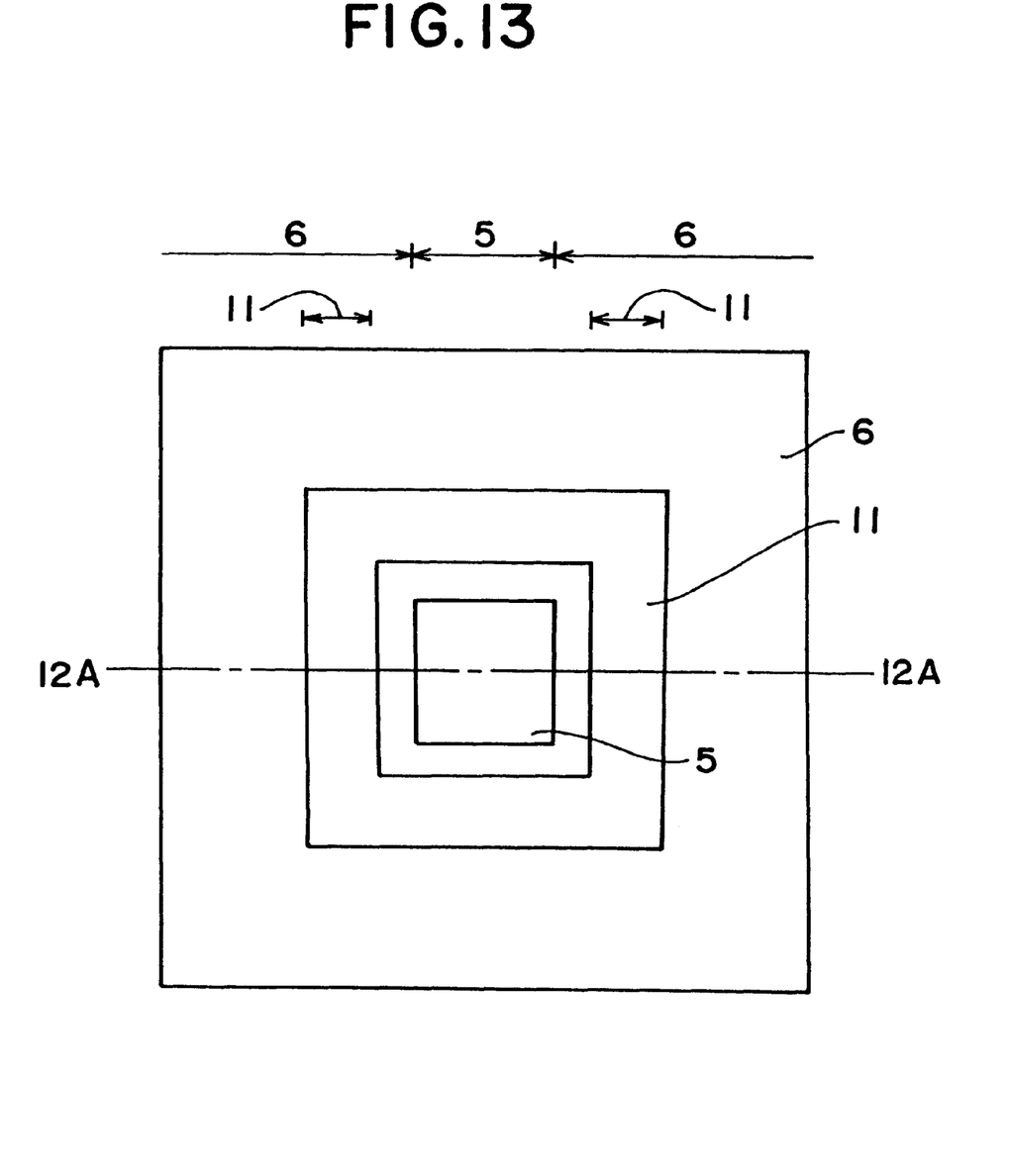
FIG. 13 is a top view of the semiconductor device of the fifth embodiment.

Then, the silicon oxide film 8 is polished and, as shown in step in FIG. 12C, is buried between single crystal silicon island layers 3. The polishing means used at this time is the same as in the method described before in connection with the first embodiment.

Subsequently, as shown in step in FIG. 12D, the silicon nitride film 4 is removed, and then as in the prior art a semiconductor element (an emitter region 3c, a base region 3d and a collector region 3e) is formed in the single crystal silicon layer 3 in the element region 5.

Figure 12D:
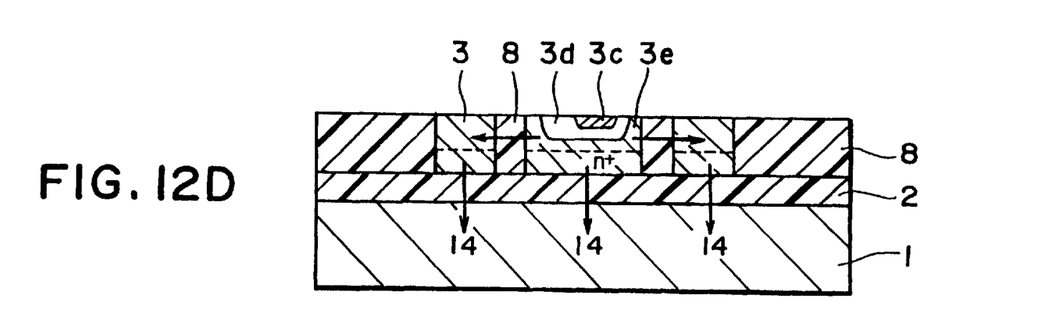

In this fifth embodiment, heat generated in the element region 5 is dissipated not only to the right underneath of the element region 6, but also it is dissipated via a route of the single crystal silicon layer 3 in the dummy region 11 to the silicon substrate 1 (see step in FIG. 12D). The reference numeral 14 in FIG. 12D shows the ways and directions of heat dissipation. It is thus possible to obtain an increased efficiency of heat dissipation to the substrate compared to the first embodiment.

The efficiency of heat dissipation can be increased by increasing the width of the dummy region 11. By excessively increasing the width, however, the effect shown in connection with the first embodiment (i.e., the effect of reducing substrate-related capacitances) is reduced. Therefore, it is necessary to set an optimum width in design.

FIGS. 14A–14D show sectional views of semiconductor chips in successive steps for describing a sixth embodiment of the invention.

Figure 14A:
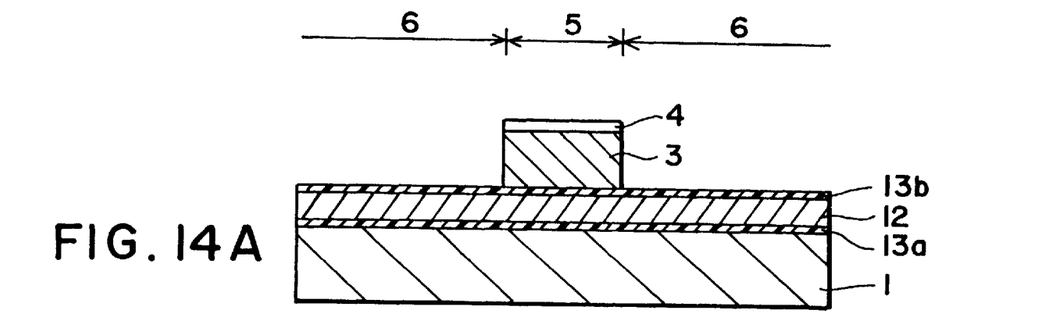
FIGS. 14A–14D are sectional views of semiconductor chips in successive steps for explaining a sixth embodiment according to the invention.

First, as shown in step in FIG. 14A, an SOI substrate is prepared, which has a single crystal silicon layer 3 formed on a silicon substrate 1 via a silicon oxide film 13a, a polycrystalline silicon film 12 and a silicon oxide film 13b.

The SOI substrate is a bonded substrate which may have a bonded surface at any position. The polycrystalline silicon film 12, however, usually has a non-flat surface. Suitably, therefore, this surface is polished before being bonded to the silicon oxide film.

Then, a silicon nitride film 4, which serves as an etching stopper in a later step, is formed thinly on the single crystal silicon layer 3, and then the silicon nitride film 4 and the single crystal silicon layer 3 in the non-element region 6 are selectively removed by the dry etching process using the ordinary photolithographic technique, thus forming a single crystal silicon island layer 3 (see step in FIG. 14A).

Figure 14B:
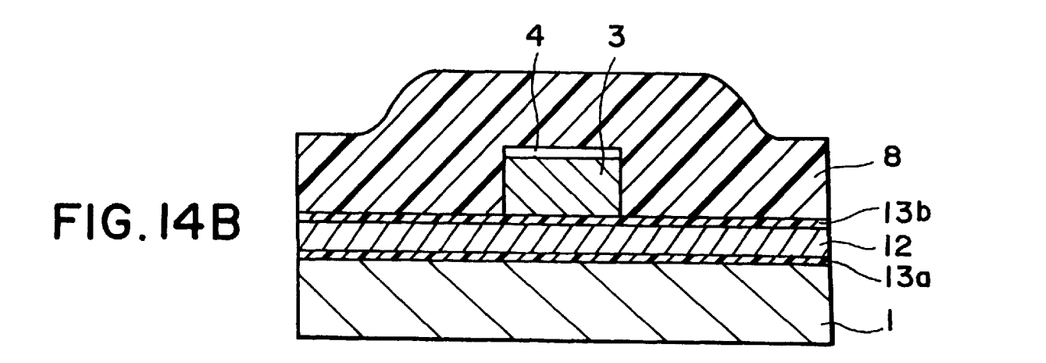
Figure 14C:
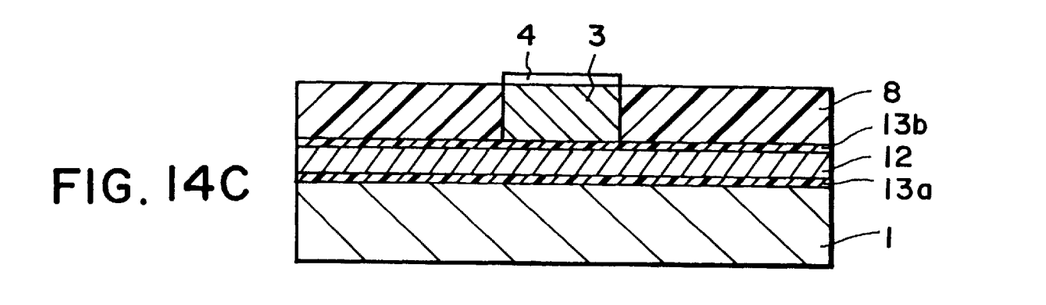

Then, as shown in steps in FIGS. 14B and 14C, like the first embodiment, a silicon oxide film 8 is deposited thickly on the entire surface, and then it is polished. Next, as shown in step in FIG. 14D, the silicon nitride film 4 is removed. Then, as in the prior art a semiconductor element (an emitter region 3c, a base region 3d and a collector region 3e) is formed in the single crystal silicon layer 3 in the element region 5.

Figure 14D:
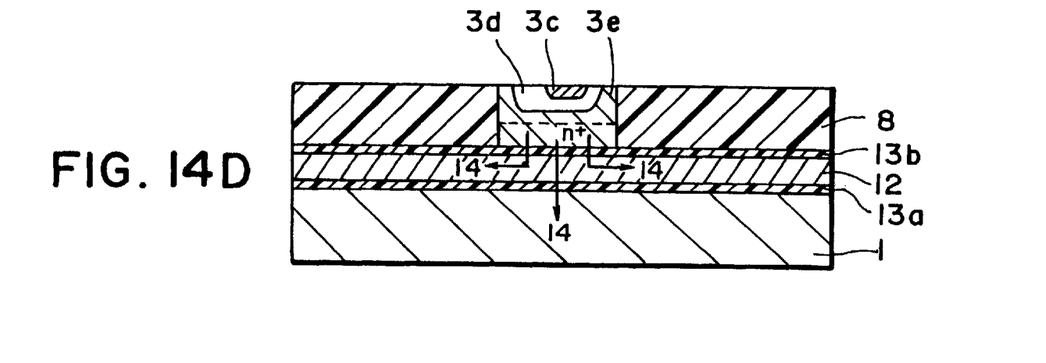

In this sixth embodiment, as shown in step in FIG. 14D, heat generated in the single crystal silicon layer 3 in the element region 5 is dissipated through the silicon oxide film 13b to the polycrystalline silicon film 12 and further through the silicon oxide film 13a dissipated to the silicon substrate 1.

In this case, the heat dissipation efficiency can be further improved by setting the thickness of the silicon oxide films 13a and 13b to 1,000 Angstroms or below.

Further, if the polycrystalline silicon film 12 sandwiched between the silicon oxide films 13a and 13b in this embodiment is not doped with any impurity, it acts as a dielectric with a dielectric constant of about 11.0.

For this reason, where non-doped polycrystalline silicon is combined with silicon oxide with a dielectric constant of about 3.9, by setting the thickness of the silicon oxide films 13a and 13b to about 1,000 Angstroms and setting the thickness of the polycrystalline silicon film 12 to about 6,000 Angstroms, the polycrystalline silicon film 12 can be assumed to be equivalent to a silicon oxide film having a thickness of 5,000 Angstroms if the polycrystalline silicon film 12 is converted into a silicon oxide film. Thus, it is possible to increase the sole heat dissipation effect without increasing the substrate-related capacitances of the element region 5.

FIGS. 15A–15D show sectional views of semiconductor chips in successive steps for describing a seventh embodiments of the invention.

First, a multi-layered SOI substrate like that in the sixth embodiment is prepared. Specifically, as shown in step in FIG. 15A, an SOI substrate is prepared, which has a single crystal silicon layer 3 formed on a silicon substrate 1 with a silicon oxide layer 13a, a polycrystalline silicon film 12 and a silicon oxide layer 13b intervening therebetween.

Figure 15A:
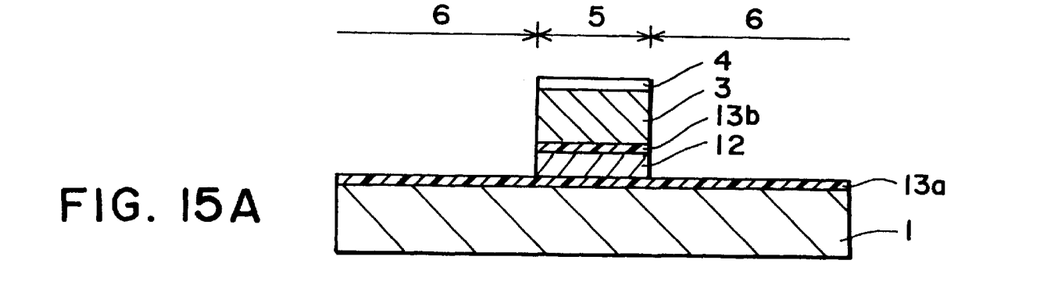
FIGS. 15A–15D are sectional views of semiconductor chips in successive steps for explaining a seventh embodiment according to the invention.

Then, a silicon nitride film 4, which serves as an etching stopper in a later step, is formed thinly on the single crystal silicon layer 3, and then the silicon nitride film 4, the single crystal silicon layer 3 and the polycrystalline silicon film 12 are selectively removed by the dry etching process using the ordinary photolithographic technique, thus forming an island lamination structure comprising the polycrystalline silicon film 12, the silicon oxide film 13b and the single crystal silicon layer 3 (see step in FIG. 15A).

Figure 15B:
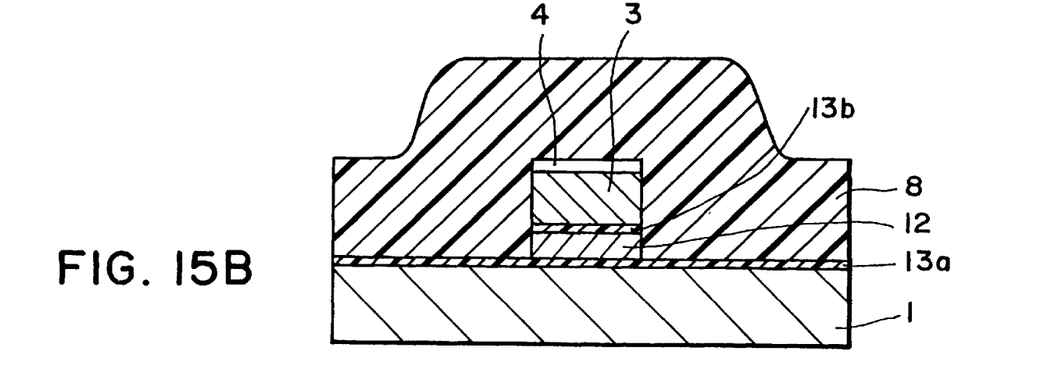
Figure 15C:
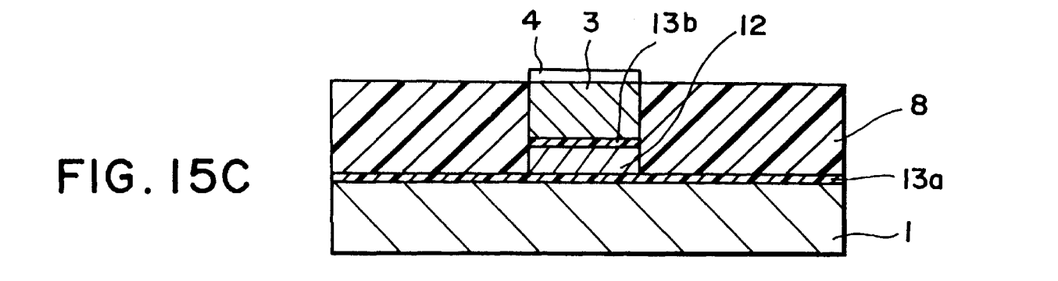

Then, as shown in steps in FIGS. 15B and 15C, like the sixth embodiment, a silicon oxide film 8 is entirely deposited thickly, and then it is polished. Then, as shown in step in FIG. 15D, the silicon nitride film 4 is removed, and then a semiconductor element (an emitter region 3c, a base region 3d and a collector region 3e) is formed in the single crystal silicon layer 3 in the element region 5.

Figure 15D:
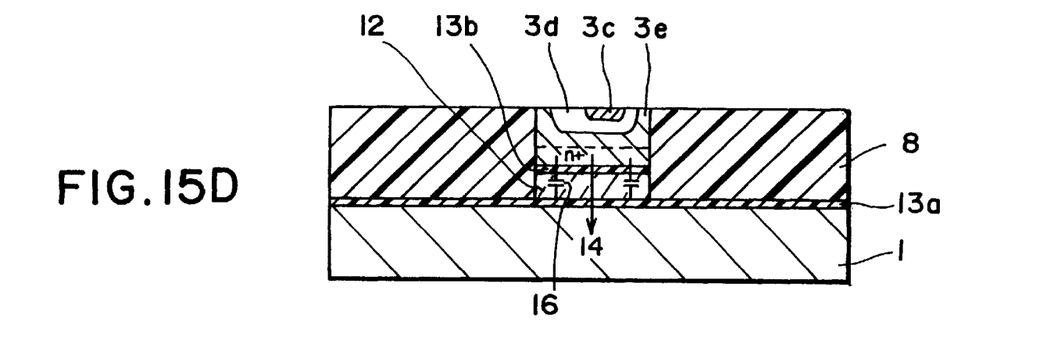

In this seventh embodiment, as shown in step in FIG. 15D, like the sixth embodiment, heat generated in the single crystal silicon layer 3 in the element region 5 is dissipated as shown by an arrow with a reference numeral 14 via the silicon oxide film 13b to the polycrystalline silicon film 12 and further via the silicon oxide film 13a to the silicon substrate 1.

This heat dissipation effect is somewhat low compared to the case of the previous sixth embodiment, but a better effect is obtainable with respect to the substrate-related capacitances.

More specifically, as shown in step in FIG. 15D, if a capacitance due to an inversion layer (inversion layer capacitance 16) develops in the polycrystalline silicon layer 12, a large capacitance may be present with respect to the substrate unless the polycrystalline silicon film 12 is isolated as in the sixth embodiment (see step in FIG. 14D).

In this seventh embodiment, unlike the sixth embodiment, since the polycrystalline silicon film 12 in addition to the single crystal silicon layer 3 is isolated by the insulator, i.e., the silicon oxide film 8 (see step in FIG. 15D), it is possible to suppress an increase in the substrate-related capacitances to a greater extent than in the sixth embodiment.

While the first to seventh embodiments of the invention have been described respectively, as further embodiments the technical contents of the second embodiment may be combined to the fifth to seventh embodiments.

Further, it is possible to use the BPSG film 9 used in the fourth embodiment in place of the silicon oxide films in the first to third and the fifth to seventh embodiments.

As has been described in detail in the foregoing, according to the invention, it is possible to obtain the following advantages:

(1) it is possible to reduce the substrate-related capacitances at wiring regions, resistive parts, etc.;

(2) it is possible to perform efficient dissipation of heat generated in element regions, wiring regions, resistive parts, etc. to the substrate;

(3) it is possible to preclude the "recession" developed in the flattening process by polishing; and (4) it is possible to reduce the number of steps for the fabrication of the element isolation structure.

Further, with the semiconductor device according to the invention, it is possible to obtain the following effects:

(A) Since the element region is left as an island on the SOI substrate while burying insulator in all the other regions, it is possible to reduce the substrate-related capacitances at the wiring regions and the resistive parts to $1/1.5 \sim 1/5$ and also reduce one photography step compared to the prior art while obtaining the substrate-related capacitance reduction effect comparable to or more than that obtainable in the prior art.

(B) The problem of the "recession in the non-element region by polishing" that is posed in the semiconductor device of the first embodiment is solved by providing a dummy region at the non-element region.

(C) The problems of the "inferior heat dissipation" posed in the semiconductor device of the first embodiment is solved by the formation of a dummy region around the element region.

(D) The efficient heat dissipation from the wiring region and resistive part is obtainable by using the "dummy region" as a high thermal conductivity silicon carbide film and using this region over a wide area of the non-element region.

(E) Efficient dissipation of heat generated in the element region to the substrate is achieved without increasing the substrate-related capacitances of the element region by using as the SOI substrate a multi-layered structure, which comprises, upwardly, the silicon substrate, the first silicon oxide film, the polycrystalline silicon film, the second silicon oxide film and the single crystal silicon layer, and in which both the first and second silicon oxide films are thinly formed to sandwich the non-doped polycrystalline silicon film between the thin silicon oxide films.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a semiconductor device having an element region and a non-element region, said method comprising the steps of:

forming a first insulating layer on a semiconductor substrate;

forming a single crystal semiconductor layer on said first insulating layer;

forming, by selectively dry-etching only said single crystal semiconductor layer so that said crystal semiconductor layer remains only in said element region and is devoid in said non-element region, a plurality of single crystal semiconductor island layers on said first insulating layer;

forming a dielectric island layer spaced apart from said single crystal semiconductor island layers by forming a dielectric film over an entire surface of said semiconductor substrate and then patterning said dielectric film, wherein said dielectric island layer has a thermal conductivity greater or equal to that of the single crystal semiconductor layers; and burying only a second insulating layer between adjacent ones of said plurality of single crystal semiconductor island layers by forming said second insulating layer over an entire surface of said semiconductor substrate, and then removing a surface portion of said second insulating layer by one of an etching process and a polishing process.

2. A method for fabricating a semiconductor device having an element region, said method comprising the steps of:

forming an insulating layer on a semiconductor substrate;

forming a single crystal silicon layer on said insulating layer;

forming, by selectively dry-etching only said single crystal silicon layer so that said crystal semiconductor layer remains only in said element region, a single crystal silicon island layer on said insulating layer;

forming a dielectric island layer spaced apart from said single crystal silicon island layer by forming a dielectric film over an entire surface of said semiconductor substrate and then patterning said dielectric film, wherein said dielectric island layer has a thermal conductivity greater or equal to that of the single crystal silicon layer; and burying only a silicon oxide film between said single crystal silicon island layer and said dielectric island layer by forming said silicon oxide film over said entire surface and then removing a surface portion of said silicon oxide film by one of an etching process and a polishing process.

3. The method for fabricating a semiconductor device according to claim 1, in which said single crystal semiconductor layer is formed of single crystal silicon.

4. The method for fabricating a semiconductor device according to claim 1, in which said insulating layer is formed of silicon oxide.

* * * * *